(12) United States Patent
Yamada

(10) Patent No.: US 8,890,206 B2
(45) Date of Patent: Nov. 18, 2014

(54) COMPOUND SEMICONDUCTOR DEVICE AND METHOD FOR MANUFACTURING THE SAME

(71) Applicant: Transphorm Japan, Inc., Yokohama (JP)

(72) Inventor: Atsushi Yamada, Isehara (JP)

(73) Assignee: Transphorm Japan, Inc., Yokohama (JP)

( * ) Notice: Subject to any disclaimer, the term of this patent is extended or adjusted under 35 U.S.C. 154(b) by 111 days.

(21) Appl. No.: 13/725,947

(22) Filed: Dec. 21, 2012

(65) Prior Publication Data
US 2013/0240949 A1 Sep. 19, 2013

(30) Foreign Application Priority Data

Mar. 19, 2012 (JP) .................................. 2012-062861

(51) Int. Cl.
*H01L 31/072* (2012.01)
*H01L 29/778* (2006.01)
*H01L 29/66* (2006.01)

(52) U.S. Cl.
CPC ........ *H01L 29/778* (2013.01); *H01L 29/66431* (2013.01)
USPC ..... 257/190; 257/183; 257/192; 257/E21.371

(58) Field of Classification Search
CPC .............. H01L 28/778; H01L 29/2003; H01L 29/66431; H01L 29/66462; H01L 29/7787
USPC ........................... 257/190, 183, 192, E21.371
See application file for complete search history.

(56) References Cited

U.S. PATENT DOCUMENTS

| | | | |
|---|---|---|---|
| 7,859,021 B2 | 12/2010 | Kaneko | |
| 7,985,987 B2 | 7/2011 | Kaneko | |
| 8,076,698 B2 | 12/2011 | Ueda et al. | |
| 2007/0230222 A1* | 10/2007 | Drabing et al. | ............ 363/21.01 |

FOREIGN PATENT DOCUMENTS

| | | |
|---|---|---|
| JP | 2005-079346 | 3/2005 |
| JP | 2007-019309 | 1/2007 |
| JP | 2009-071061 | 4/2009 |
| JP | 2009-076845 | 4/2009 |

OTHER PUBLICATIONS

KIPO,Office Action of Korean Application No. 10-2012-154575 dated Dec. 30, 2013, mailed in connection with a KR national application corresponding to the above-referenced US application.
P. R. C. Kent et al.; "Biaxial strain-modified valence and conduction band offsets of zinc-blende GaN, GaP, GaAs, InN, InP, and InAs, and optical bowing of strained epitaxial InGaN alloys", Applied Physics Letters, vol. 81, No. 23, pp. 4377-4379 (2002).
KIPO Notice of Final Rejection in corresponding KR Application No. 10-2012- 154575, mailed Jun. 26, 2014, 5 pages.

* cited by examiner

*Primary Examiner* — Andy Huynh
(74) *Attorney, Agent, or Firm* — Fish & Richardson P.C.

(57) ABSTRACT

An AlGaN/GaN HEMT includes a compound semiconductor laminated structure, a gate electrode formed above the compound semiconductor laminated structure, and a p-type semiconductor layer formed between the compound semiconductor laminated structure and the gate electrode, and the p-type semiconductor layer has tensile strain in a direction parallel to a surface of the compound semiconductor laminated structure.

4 Claims, 12 Drawing Sheets

COMPOUND SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2012-062861, filed on Mar. 19, 2012, the entire contents of which are incorporated herein by reference.

FIELD

The present embodiments relate to a compound semiconductor device and a method for manufacturing the compound semiconductor device.

BACKGROUND

The idea of applying a nitride semiconductor to a high-voltage, high-power semiconductor device by taking advantage of features such as a high saturated electron velocity and a wide band gap is under consideration. For example, GaN that is a nitride semiconductor has a band gap of 3.4 eV larger than the band gap (1.1 eV) of Si and the band gap (1.4 eV) of GaAs and has a high breakdown electric field strength. For this reason, GaN is a very promising material for a power semiconductor device for high-voltage operation and high power.

Devices using a nitride semiconductor include field-effect transistors. There have been numerous reports on field-effect transistors, particularly high electron mobility transistors (HEMTs). For example, among GaN-based HEMTs (GaN HEMTs), an AlGaN/GaN HEMT using GaN in an electron transit layer and AlGaN in an electron supply layer is attracting attention. In an AlGaN/GaN HEMT, strain occurs in AlGaN due to the difference in lattice constant between GaN and AlGaN. Piezoelectric polarization resulting from the strain and spontaneous polarization of AlGaN lead to formation of a high concentration of two-dimensional electron gas (2DEG). Accordingly, an AlGaN/GaN HEMT is expected to serve as a high-efficiency switching device or a high-voltage power device for an electric vehicle or the like.

Patent Document 1: Japanese Laid-open Patent Publication No. 2009-076845

Patent Document 2: Japanese Laid-open Patent Publication No. 2007-019309

Non-Patent Document 1: Applied Physics Letters Biaxial strain-modified valence and conduction band offsets of zinc-blende GaN, GaP, GaAs, InN, InP, and InAs, and optical bowing of strained epitaxial InGaN alloys P. R. C. Kent, Gus L. W. Hart, and Alex Zunger National Renewable Energy Laboratory, Golden, Colo. 80401 Received 3 Jul. 2002; accepted 2 Oct. 2002

There is demand for a technique for locally controlling the amount of 2DEG generated in nitride semiconductor devices. For example, in the case of a HEMT, so-called normally-off operation in which no electric current flows when the voltage is off is desired from a so-called fail-safe standpoint. Realization of normally-off operation requires a contrivance to reduce the amount of 2DEG generated below a gate electrode when the voltage is off.

As one method for realizing a GaN HEMT which operates in a normally-off manner, there is proposed the process of forming a p-type GaN layer on an electron supply layer and counteracting 2DEG at a part below the p-type GaN layer to realize normally-off operation. In the process, p-type GaN is grown across a surface of, e.g., AlGaN serving as an electron supply layer, the p-type GaN is dry-etched such that a part where a gate electrode is to be formed is left and forms a p-type GaN layer, and a gate electrode is formed on the p-type GaN layer.

The activation rate of p-type GaN is low. For this reason, to cause a p-type GaN layer to generate a carrier enough to counteract a portion of 2DEG corresponding in position to the p-type GaN layer, the p-type GaN layer needs to be correspondingly thick. The formation of the thick p-type GaN layer leads to difficulty in etching. The formation also leads to difficulty in gate control, which causes deterioration of device performance.

SUMMARY

In one aspect, a semiconductor device includes a compound semiconductor laminated structure, an electrode formed above the compound semiconductor laminated structure, and a p-type semiconductor layer formed between the compound semiconductor laminated structure and the electrode, and the p-type semiconductor layer has tensile strain in a direction parallel to a surface of the compound semiconductor laminated structure.

In one aspect, a method for manufacturing a compound semiconductor device includes forming a compound semiconductor laminated structure and forming a p-type semiconductor layer in an electrode forming region above the compound semiconductor laminated structure, and the p-type semiconductor layer has tensile strain in a direction parallel to a surface of the compound semiconductor laminated structure.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will be described below in detail with reference to the drawings. In the embodiments below, the configuration of a compound semiconductor device will be described together with a method for manufacturing the compound semiconductor device.

Note that some components may not be illustrated in relatively accurate size and thickness for convenience of illustration.

First Embodiment

The present embodiment discloses an AlGaN/GaN HEMT as a compound semiconductor device.

FIGS. 1A to 2B are schematic sectional views illustrating, in the order of steps, a method for manufacturing an AlGaN/GaN HEMT according to the first embodiment.

Figure 1A:
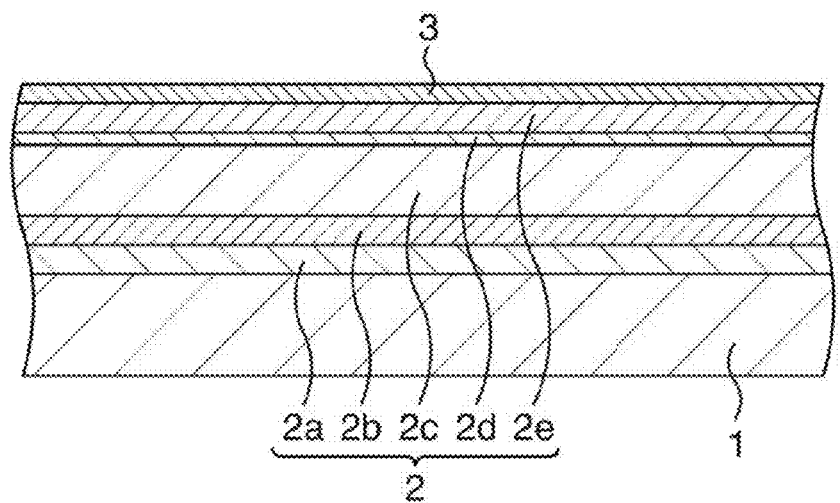
FIGS. 1A to 1C are schematic sectional views illustrating, in the order of steps, a method for manufacturing an AlGaN/GaN HEMT according to a first embodiment.

As illustrated in FIG. 1A, a compound semiconductor laminated structure 2 and a p-type semiconductor layer 3 are first formed on, for example, a semi-insulating SiC substrate 1 as a growth substrate. As the growth substrate, a sapphire substrate, a GaAs substrate, an Si substrate, a GaN substrate, or the like may be used instead of an SiC substrate. The substrate may be semi-insulating or conductive.

The compound semiconductor laminated structure 2 includes a nucleation layer 2a, a tensile strain applying layer 2b, an electron transit layer 2c, an intermediate layer (spacer layer) 2d, and an electron supply layer 2e. The p-type semiconductor layer 3 is formed on the electron supply layer 2e.

More specifically, the compound semiconductors below are epitaxially grown on the SiC substrate 1 by, e.g., metal organic vapor phase epitaxy (MOVPE). Molecular beam epitaxy (MBE) or the like may be used instead of MOVPE.

Compound semiconductors to serve as the nucleation layer 2a, tensile strain applying layer 2b, electron transit layer 2c, intermediate layer 2d, electron supply layer 2e, and p-type semiconductor layer 3 are grown in order on the SiC substrate 1. The nucleation layer 2a is formed by growing AlN to a thickness of, e.g., about 0.1 μm on the SiC substrate 1. The tensile strain applying layer 2b is formed by growing a compound semiconductor which has a higher lattice constant than the tensile strain applying layer 2b (i-InGaN (intentionally undoped InGaN) in this embodiment) to a thickness of, e.g., about 2 μm such that the compound semiconductor is fully relaxed. The electron transit layer 2c is formed by growing i-GaN to a thickness of, e.g., about 300 nm. The intermediate layer 2d is formed by growing i-AlGaN to a thickness of, e.g., about 5 nm. The electron supply layer 2e is formed by growing n-AlGaN to a thickness of, e.g., about 30 nm. The p-type semiconductor layer 3 is formed by growing p-GaN to a thickness of, e.g., about 100 nm. The intermediate layer 2d may not be formed. The electron supply layer may be formed from i-AlGaN.

A gaseous mixture of trimethyl gallium (TMGa) gas serving as a Ga source and ammonia ($NH_3$) gas is used as a source gas to grow GaN. A gaseous mixture of trimethyl aluminum (TMAl) gas, TMGa gas, and $NH_3$ gas is used as a source gas to grow AlGaN. A gaseous mixture of trimethyl indium (TMIn) gas, TMGa gas, and $NH_3$ gas is used as a source gas to grow InGaN. Whether to supply TMAl gas, TMGa gas, and TMIn gas and the flow rates of the gases are appropriately set according to a compound semiconductor layer to be grown. The flow rates of $NH_3$ gas as a common material are set to about 100 sccm to 10 slm. The growth pressures are set to about 50 to 760 Torr, and the growth temperatures are set to about 800 to 1200° C.

When AlGaN is to be grown as n-type, i.e., when the electron supply layer 2e (n-AlGaN) is to be formed, an n-type impurity is added to the source gas of AlGaN. In this embodiment, for example, silane ($SiH_4$) gas containing Si is added to the source gas at a predetermined flow rate, and AlGaN is doped with Si. The doping concentration of Si is set to about $1\times10^{18}/cm^3$ to $1\times10^{20}/cm^3$ (e.g., $5\times10^{18}/cm^3$).

When GaN is to be grown as p-type, i.e., when the p-type semiconductor layer 3 (p-GaN) is to be formed, a p-type impurity such as one selected from Mg and Be is added to the source gas of GaN. In the present embodiment, Mg is used as the p-type impurity. Mg is added to the source gas at a predetermined flow rate, and GaN is doped with the Mg. The doping concentration of Mg is set to, e.g., about $1\times10^{16}/cm^3$ to about $1\times10^{21}/cm^3$. If the doping concentration is lower than about $1\times10^{16}/cm^3$, the GaN does not become sufficiently p-type, which leads to normally-on operation. If the doping concentration is higher than about $1\times10^{21}/cm^3$, the crystallinity deteriorates, and sufficient characteristics are not achieved. Accordingly, the doping concentration of Mg set to about $1\times10^{16}/cm^3$ to about $1\times10^{21}/cm^3$ makes the GaN a p-type semiconductor with sufficient characteristics. In the present embodiment, the doping concentration of Mg of the p-type semiconductor layer 3 is set to about $5\times10^{19}/cm^3$.

Figure 1B:
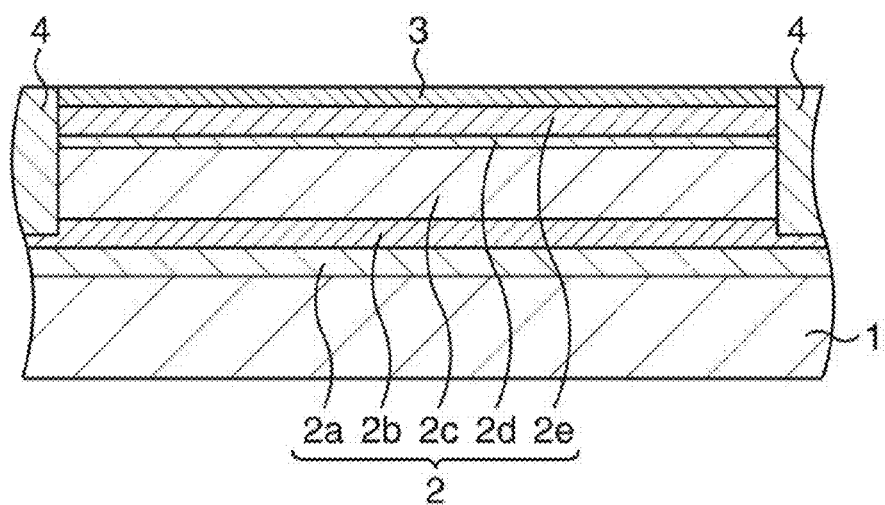

As illustrated in FIG. 1B, a device isolation structure 4 is formed.

More specifically, for example, argon (Ar) is injected into a device isolation region of the compound semiconductor laminated structure 2. With this process, the device isolation structure 4 is formed at the compound semiconductor laminated structure 2. The device isolation structure 4 defines an active region on the compound semiconductor laminated structure 2.

Note that the device isolation may be performed by any other known method such as shallow trench isolation (STI) instead of the injection. In this case, a chlorinated etching gas is used for dry etching of the compound semiconductor laminated structure 2.

Figure 1C:
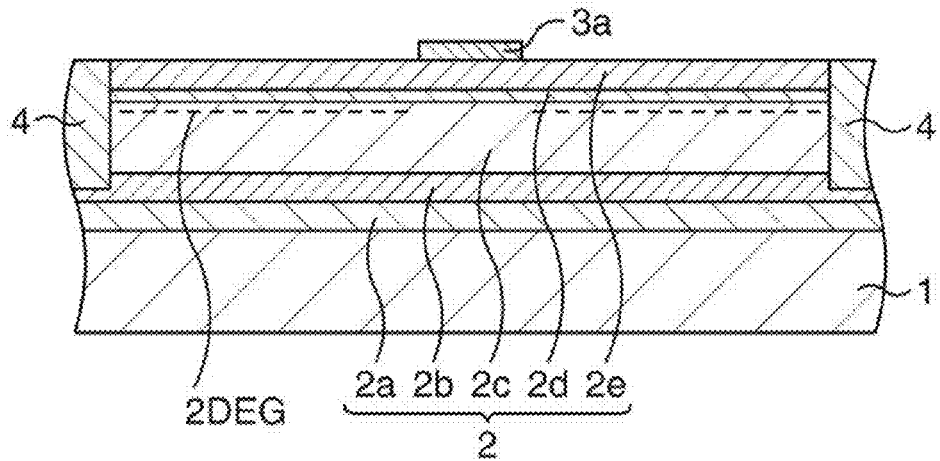

As illustrated in FIG. 1C, the p-type semiconductor layer 3 is processed.

More specifically, a resist is applied onto the p-type semiconductor layer 3. The resist is processed by lithography to form a resist mask which covers only a portion corresponding to a part where a gate electrode of the p-type semiconductor layer 3 is intended to be formed and exposes the rest. The p-type semiconductor layer 3 is dry-etched using the resist mask. With the dry etching, a portion exposed in an opening of the resist mask of the p-type semiconductor layer 3 is etched and removed, and the p-type semiconductor layer 3 is left only at the intended gate electrode forming part on the electron supply layer 2e. The left p-type semiconductor layer 3 is illustrated as a p-type semiconductor layer 3a.

In the compound semiconductor laminated structure 2, piezoelectric polarization resulting from strain caused by the difference in lattice constant between GaN and AlGaN occurs at an interface of the electron transit layer 2c with the electron supply layer 2e (an interface with the intermediate layer 2d to be exact, hereinafter referred to as a GaN/AlGaN interface). With effects of the piezoelectric polarization combined with effects of spontaneous polarization of the electron transit layer 2c and electron supply layer 2e, if the p-type semiconductor layer 3a is not formed, a high concentration of two-dimensional electron gas (2DEG) is generated across the GaN/AlGaN interface.

In the present embodiment, the electron transit layer 2c made of GaN is lattice-matched to the tensile strain applying layer 2b made of InGaN having a higher lattice constant than GaN, and tensile strain is applied to the electron transit layer 2c. The p-type semiconductor layer 3a made of GaN above the electron transit layer 2c is affected by the tensile strain applied to the electron transit layer 2c, and tensile strain is similarly applied to the p-type semiconductor layer 3a.

Figure 3:
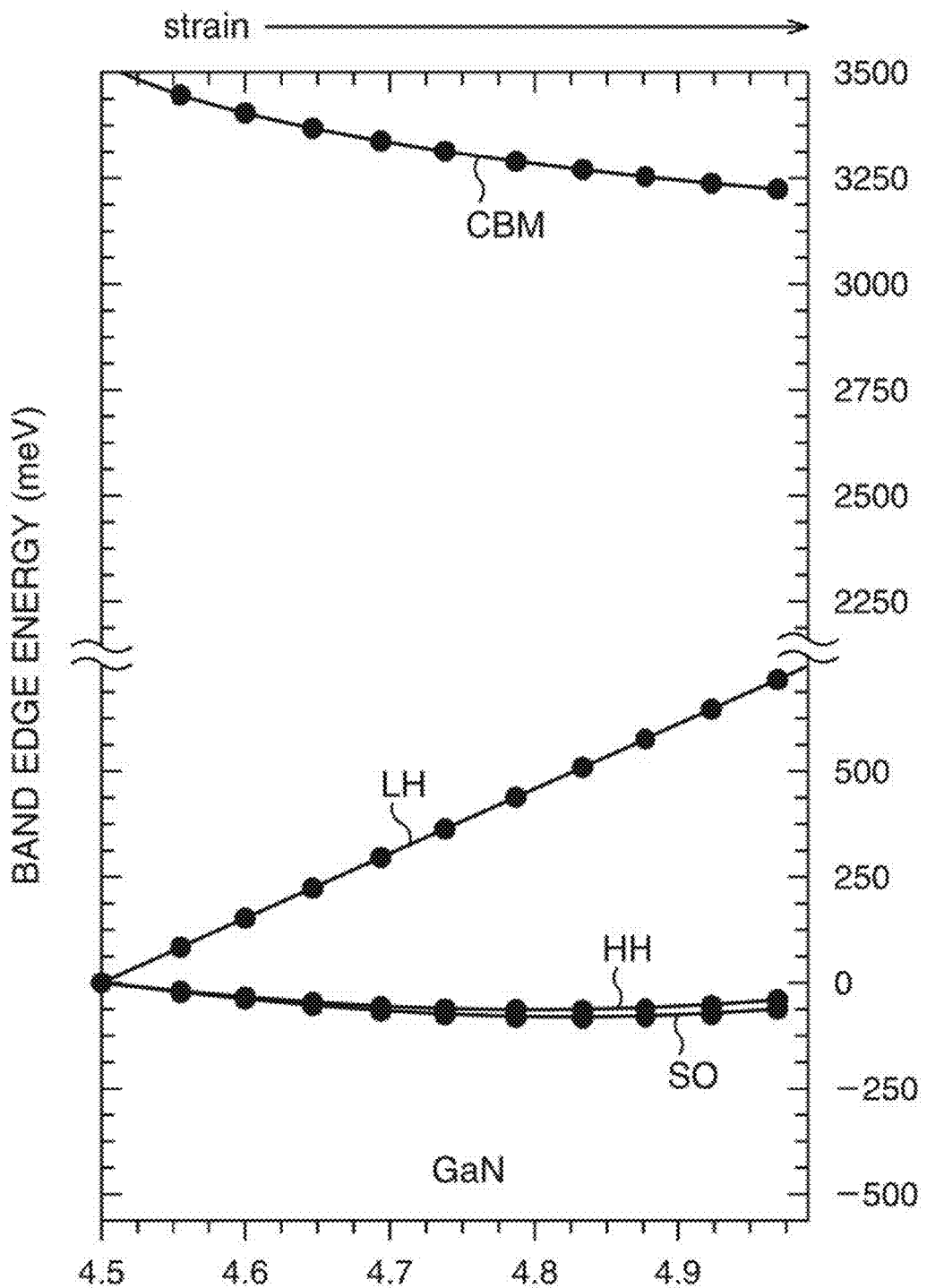
FIG. 3 is a graph illustrating the relationship between strain and band energy when the strain is applied to GaN.

The relationship between stress and band energy when strain is applied to GaN is illustrated in FIG. 3 (see Non-Patent Document 1).

FIG. 3 confirms that application of tensile strain to GaN separates HH and LH and reduces Eg. The application of tensile strain to the p-type semiconductor layer 3a increases the activation rate of the p-type impurity (Mg) serving as an acceptor in the p-type semiconductor layer 3a. The p-type semiconductor layer 3a counteracts 2DEG at the GaN/AlGaN interface only at a portion corresponding in position to the p-type semiconductor layer 3a to cause the portion to disappear. Since the activation rate of the p-type impurity (Mg) of the p-type semiconductor layer 3a is high in the present embodiment, even if the p-type semiconductor layer 3a is relatively thin, the p-type semiconductor layer 3a can sufficiently counteract 2DEG. Accordingly, a high concentration of 2DEG is secured at a portion requiring 2DEG, and 2DEG disappears efficiently only at the portion corresponding in position to the intended gate electrode forming part. This realizes reliable normally-off operation.

Figure 2A:
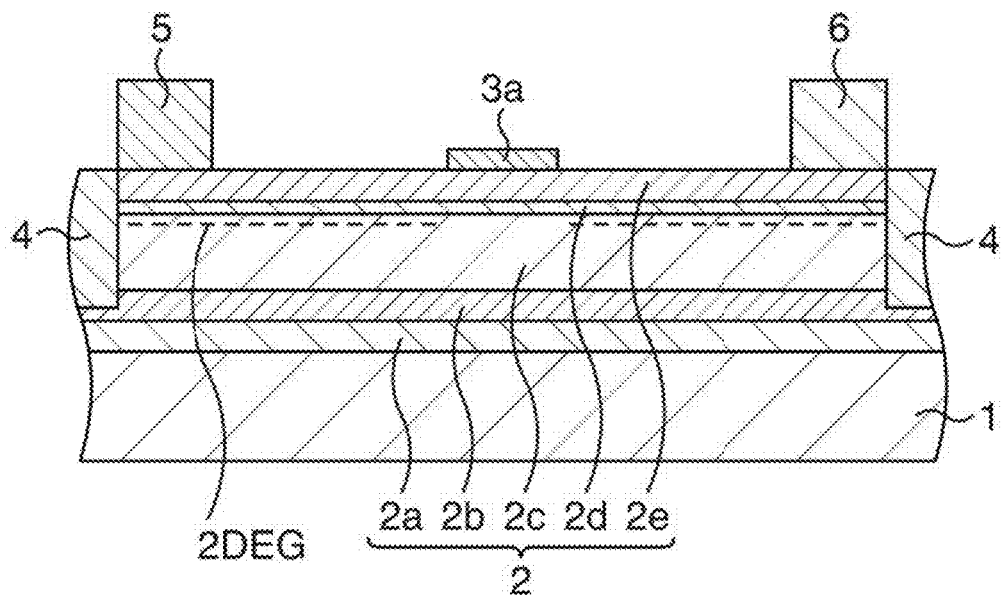
FIGS. 2A and 2B are schematic sectional views illustrating, in the order of steps, the method for manufacturing the AlGaN/GaN HEMT according to the first embodiment, following FIGS. 1A to 1C.

As illustrated in FIG. 2A, a source electrode 5 and a drain electrode 6 are formed.

A resist mask for forming the source electrode and drain electrode is first formed. For example, a double-layer resist with an overhang structure suitable for evaporation or lift-off is used here. The resist is applied to the compound semiconductor laminated structure 2, and openings for exposing parts on the electron supply layer 2e where the source electrode and drain electrode are intended to be formed are formed. With the above-described process, the resist mask having the openings is formed.

For example, Ta and Al as an electrode material are deposited on the resist mask and in the openings by, e.g., evaporation. The thickness of Ta is set to about 20 nm, and the thickness of Al is set to about 200 nm. The resist mask and Ta and Al deposited on the resist mask are removed by lift-off. After that, the SiC substrate 1 is heat-treated at a temperature of about 400 to 1000° C. (e.g., about 550° C.) in, for example, a nitrogen atmosphere. Remaining Ta and Al are made to form an ohmic contact with the electron supply layer 2e. The heat treatment may be unnecessary if Ta and Al can form an ohmic contact with the electron supply layer 2e. With the above-described processes, the source electrode 5 and drain electrode 6 are formed on the electron supply layer 2e.

Figure 2B:
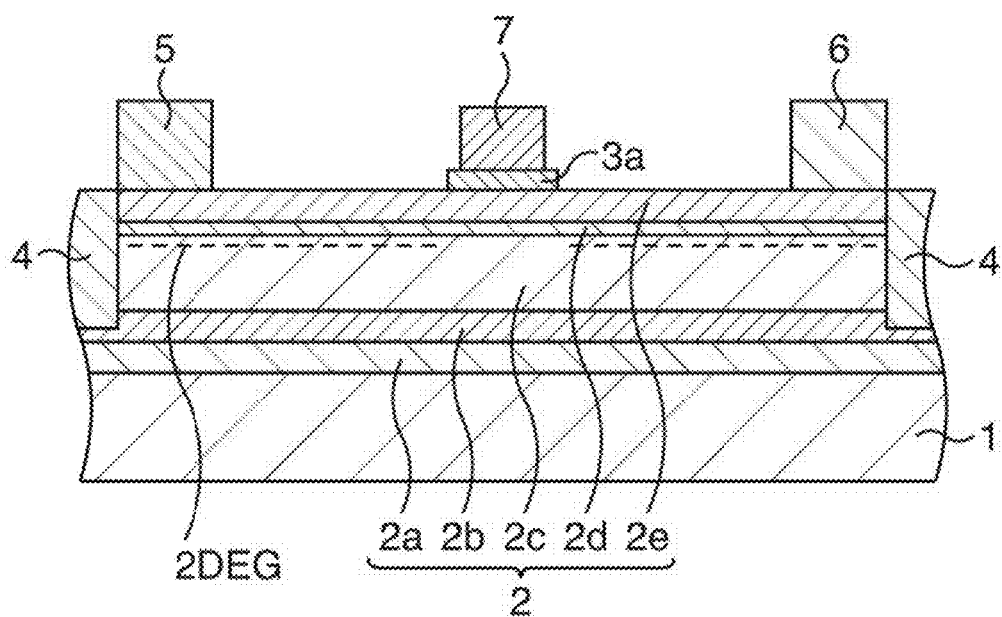

As illustrated in FIG. 2B, a gate electrode 7 is formed.

More specifically, a resist mask for forming the gate electrode is first formed. For example, a double-layer resist with an overhang structure suitable for evaporation or lift-off is used here. The resist is applied to the compound semiconductor laminated structure 2, and an opening for exposing a surface of the p-type semiconductor layer 3a is formed. With the above-described process, the resist mask having the opening is formed.

For example, Ni and Au as an electrode material are deposited on the resist mask and in the opening that exposes a surface in an Mg diffusion region by, e.g., evaporation. The thickness of Ni is set to about 30 nm, and the thickness of Au is set to about 400 nm. The resist mask and Ni and Au deposited on the resist mask are removed by lift-off. With the above-described processes, the gate electrode 7 is formed on the p-type semiconductor layer 3a.

After steps such as formation of pieces of wires to be connected to the source electrode 5, drain electrode 6, and gate electrode 7, an AlGaN/GaN HEMT according to the present embodiment is formed.

As has been described above, according to the present embodiment, the tensile strain applying layer 2b formed on the lower side of the electron transit layer 2c and the p-type semiconductor layer 3a formed on the electron supply layer 2e cause 2DEG at the GaN/AlGaN interface to disappear only in a region corresponding in position to the p-type semiconductor layer 3a. With the above-described configuration, the energy band below the gate electrode 7 is raised, reliable normally-off operation is realized, and a high-quality, highly reliable AlGaN/GaN HEMT is achieved.

Second Embodiment

The present embodiment discloses an AlGaN/GaN HEMT, like the first embodiment. The present embodiment, however, is different from the first embodiment in how tensile strain is applied to a p-type semiconductor layer.

FIGS. 4A to 5B are schematic sectional views illustrating, in the order of steps, a method for manufacturing an AlGaN/GaN HEMT according to the second embodiment. Note that the same components as those in the first embodiment are denoted by the same reference numerals and that a detailed description thereof will be omitted. 2DEG generated at a GaN/AlGaN interface is illustrated only in FIGS. 5A and 5B for convenience of illustration.

Figure 4A:
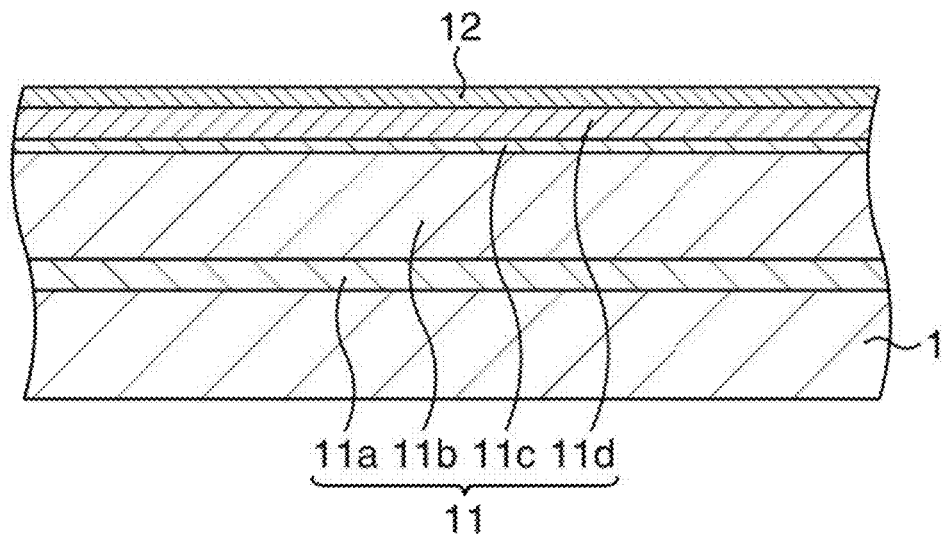
FIGS. 4A and 4B are schematic sectional views illustrating, in the order of steps, a method for manufacturing an AlGaN/GaN HEMT according to a second embodiment.

As illustrated in FIG. 4A, a compound semiconductor laminated structure 11 and a p-type semiconductor layer 12 are first formed on, for example, a semi-insulating SiC substrate 1 as a growth substrate.

The compound semiconductor laminated structure 11 includes a nucleation layer 11a, an electron transit layer 11b, an intermediate layer (spacer layer) 11c, and an electron supply layer 11d. The p-type semiconductor layer 12 is formed on the electron supply layer 11d.

More specifically, the compound semiconductors below are epitaxially grown on the SiC substrate 1 by, e.g., MOVPE. Molecular beam epitaxy or the like may be used instead of MOVPE.

Compound semiconductors to serve as the nucleation layer 11a, electron transit layer 11b, intermediate layer 11c, electron supply layer 11d, and p-type semiconductor layer 12 are grown in order on the SiC substrate 1. The nucleation layer 11a is formed by growing AlN to a thickness of, e.g., about 0.1 μm on the SiC substrate 1. The electron transit layer 11b is formed by growing i-GaN to a thickness of, e.g., about 3 μm. The intermediate layer 11c is formed by growing i-AlGaN to a thickness of, e.g., about 5 nm. The electron supply layer 11d is formed by growing n-AlGaN to a thickness of, e.g., about 30 nm. The p-type semiconductor layer 12 is formed by growing p-GaN to a thickness of, e.g., about 30 nm. The intermediate layer 11c may not be formed. The electron supply layer may be formed from i-AlGaN.

A gaseous mixture of TMGa gas serving as a Ga source and $NH_3$ gas is used as a source gas to grow GaN. A gaseous mixture of TMAl gas, TMGa gas, and $NH_3$ gas is used as a source gas to grow AlGaN. Whether to supply TMAl gas and TMGa gas and the flow rates of the gases are appropriately set according to a compound semiconductor layer to be grown. The flow rates of $NH_3$ gas as a common material are set to about 100 sccm to 10 slm. The growth pressures are set to about 50 to 760 Torr, and the growth temperatures are set to about 800 to 1200° C.

When AlGaN is to be grown as n-type, i.e., when the electron supply layer 11d (n-AlGaN) is to be formed, an n-type impurity is added to the source gas of AlGaN. In this embodiment, for example, silane ($SiH_4$) gas containing Si is added to the source gas at a predetermined flow rate, and AlGaN is doped with Si. The doping concentration of Si is set to about $1 \times 10^{18}/cm^3$ to $1 \times 10^{20}/cm^3$ (e.g., $5 \times 10^{18}/cm^3$).

When GaN is to be grown as p-type, i.e., when the p-type semiconductor layer 12 (p-GaN) is to be formed, a p-type impurity such as one selected from Mg and C is added to the source gas of GaN. In the present embodiment, Mg is used as the p-type impurity. Mg is added to the source gas at a predetermined flow rate, and GaN is doped with the Mg. The doping concentration of Mg is set to, e.g., about $1 \times 10^{16}/cm^3$ to about $1 \times 10^{21}/cm^3$. If the doping concentration is lower than about $1 \times 10^{16}/cm^3$, the GaN does not become sufficiently p-type, which leads to normally-on operation. If the doping concentration is higher than about $1 \times 10^{21}/cm^3$, the crystallinity deteriorates, and sufficient characteristics are not achieved. Accordingly, the doping concentration of Mg set to about $1 \times 10^{16}/cm^3$ to about $1 \times 10^{21}/cm^3$ makes the Ga a p-type semiconductor with sufficient characteristics. In the present embodiment, the doping concentration of Mg of the p-type semiconductor layer 12 is set to about $5 \times 10^{19}/cm^3$.

Figure 4B:
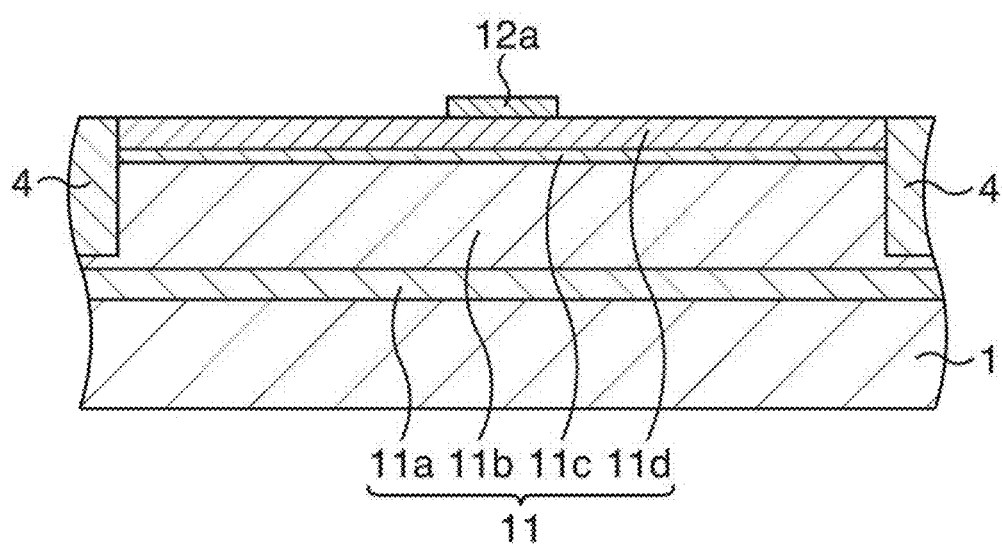

As illustrated in FIG. 4B, the p-type semiconductor layer 12 is processed.

For example, Ar is first injected into a device isolation region of the compound semiconductor laminated structure 11, as in FIG. 1B associated with the first embodiment. With this process, a device isolation structure 4 is formed at the compound semiconductor laminated structure 11.

A resist is applied onto the p-type semiconductor layer 12. The resist is processed by lithography to form a resist mask which covers only a portion corresponding to a part where a gate electrode of the p-type semiconductor layer 12 is intended to be formed and exposes the rest. The p-type semiconductor layer 12 is dry-etched using the resist mask. With the dry etching, a portion exposed in an opening of the resist mask of the p-type semiconductor layer 12 is etched and removed, and the p-type semiconductor layer 12 is left only at the intended gate electrode forming part on the electron supply layer 11d. The left p-type semiconductor layer 12 is illustrated as a p-type semiconductor layer 12a.

Figure 5A:
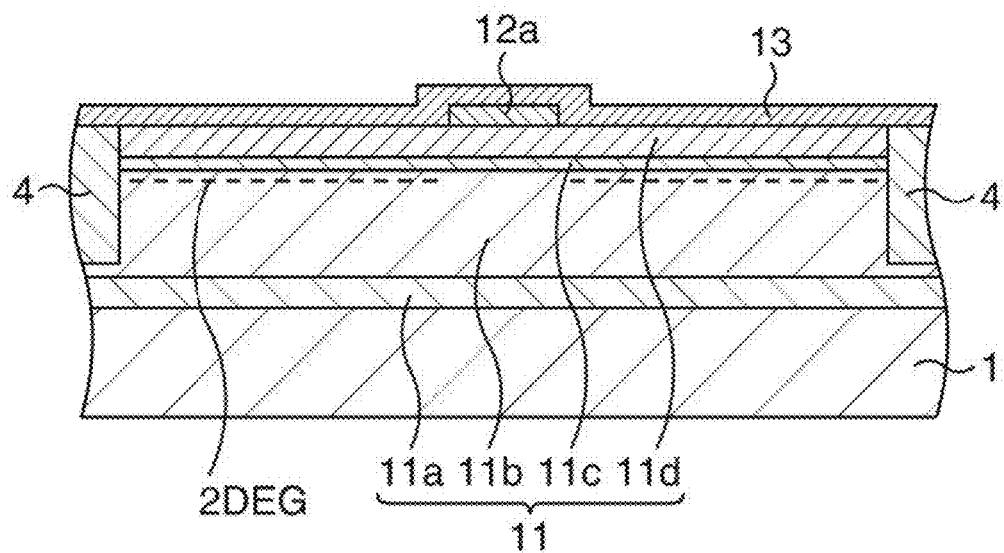
FIGS. 5A and 5B are schematic sectional views illustrating, in the order of steps, the method for manufacturing the AlGaN/GaN HEMT according to the second embodiment, following FIGS. 4A and 4B.

As illustrated in FIG. 5A, a tensile strain applying film 13 is formed.

More specifically, an insulating film (a silicon nitride film (SiN) in this embodiment) which has the property of giving tensile stress to surroundings is formed on the electron supply layer 11d by, e.g., thermal CVD so as to cover at least a side surface (the whole in this embodiment) of the p-type semiconductor layer 12a. With this process, the tensile strain applying film 13 is formed, and the tensile strain applying film 13 applies tensile strain to the p-type semiconductor layer 12a. Note that a silicon oxide film ($SiO_2$) which has the property of applying tensile stress to surroundings may be formed instead of SiN.

In the compound semiconductor laminated structure 11, piezoelectric polarization resulting from strain caused by the difference in lattice constant between GaN and AlGaN occurs at an interface of the electron transit layer 11b with the electron supply layer 11d (an interface with the intermediate layer 11c to be exact, hereinafter referred to as a GaN/AlGaN interface). With effects of the piezoelectric polarization combined with effects of spontaneous polarization of the electron transit layer 11b and electron supply layer 11d, if the p-type semiconductor layer 12a is not formed, a high concentration of two-dimensional electron gas (2DEG) is generated across the GaN/AlGaN interface.

In the present embodiment, the tensile strain applying film 13 covering the p-type semiconductor layer 12a applies tensile strain to the p-type semiconductor layer 12a. The application increases the activation rate of the p-type impurity (Mg) serving as an acceptor in the p-type semiconductor layer 12a. The p-type semiconductor layer 12a counteracts 2DEG at the GaN/AlGaN interface only at a portion corresponding in position to the p-type semiconductor layer 12a to cause the portion to disappear. Since the activation rate of the p-type impurity (Mg) of the p-type semiconductor layer 12a is high in the present embodiment, even if the p-type semiconductor layer 12a is relatively thin, the p-type semiconductor layer 12a can sufficiently counteract 2DEG. Accordingly, a high concentration of 2DEG is secured at a portion requiring 2DEG, and 2DEG disappears efficiently only at the portion corresponding in position to the intended gate electrode forming part. This realizes reliable normally-off operation.

Figure 5B:
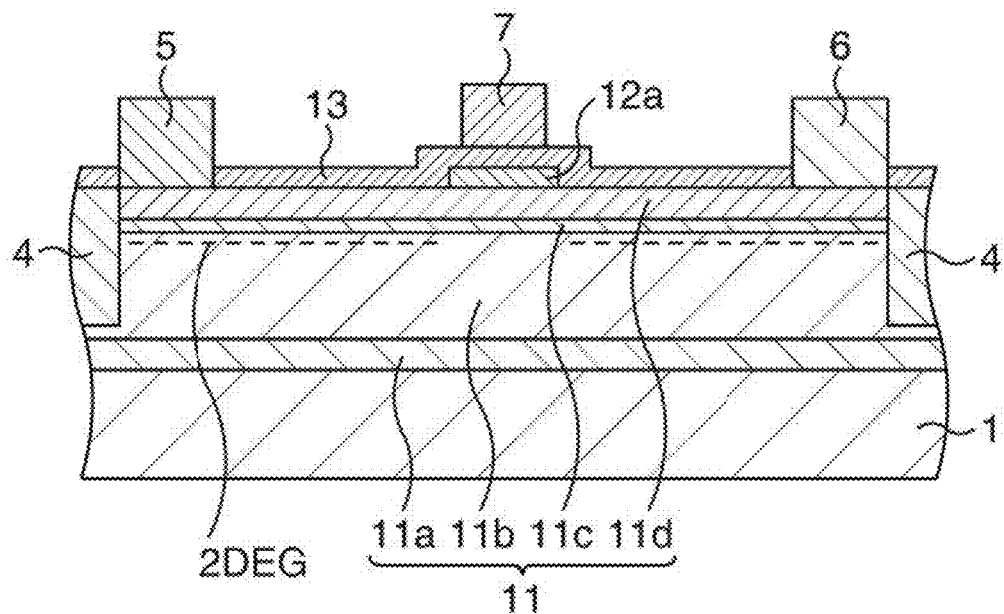

The steps in FIGS. 2A and 2B are performed in order, like the first embodiment. With the steps, as illustrated in FIG. 5B, a source electrode 5 and a drain electrode 6 are formed on the electron supply layer 11d, and a gate electrode 7 corresponding in position to the p-type semiconductor layer 12a is formed on the tensile strain applying film 13.

After steps such as formation of pieces of wires to be connected to the source electrode 5, drain electrode 6, and gate electrode 7, an AlGaN/GaN HEMT according to the present embodiment is formed.

As has been described above, according to the present embodiment, the p-type semiconductor layer 12a is formed on the electron supply layer 11d, and the tensile strain applying film 13 that applies tensile strain to the p-type semiconductor layer 12a is formed so as to cover the p-type semiconductor layer 12a. The formation of the p-type semiconductor layer 12a and tensile strain applying film 13 causes 2DEG at the GaN/AlGaN interface to disappear only in a region corresponding in position to the p-type semiconductor layer 12a. With the above-described configuration, the energy band below the gate electrode 7 is raised, reliable normally-off operation is realized, and a high-quality, highly reliable AlGaN/GaN HEMT is achieved.

Third Embodiment

The present embodiment discloses an AlGaN/GaN HEMT, like the first and second embodiments. The present embodiment, however, is different from the first and second embodiments in how tensile strain is applied to a p-type semiconductor layer.

FIGS. 6A to 7B are schematic sectional views illustrating, in the order of steps, a method for manufacturing an AlGaN/GaN HEMT according to the third embodiment. Note that the same components as those in the first and second embodiments are denoted by the same reference numerals and that a detailed description thereof will be omitted.

Figure 6A:
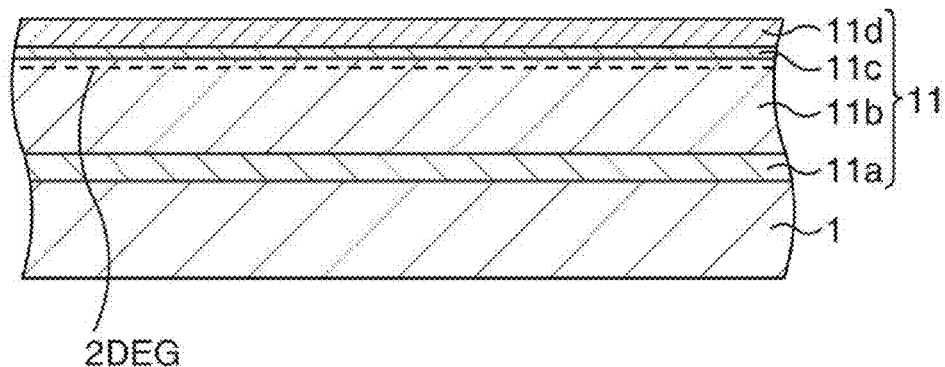
FIGS. 6A to 6C are schematic sectional views illustrating, in the order of steps, main steps of a method for manufacturing a MIS-type AlGaN/GaN HEMT according to a third embodiment.

As illustrated in FIG. 6A, a compound semiconductor laminated structure 11 is first formed on an SiC substrate 1 by growing a nucleation layer 11a, an electron transit layer 11b, an intermediate layer 11c, and an electron supply layer 11d in order by MOVPE, as in FIG. 4A associated with the second embodiment.

In the compound semiconductor laminated structure 11, piezoelectric polarization resulting from strain caused by the difference in lattice constant between GaN and AlGaN occurs at an interface of the electron transit layer 11b with the electron supply layer 11d (an interface with the intermediate layer 11c to be exact, hereinafter referred to as a GaN/AlGaN interface). With effects of the piezoelectric polarization combined with effects of spontaneous polarization of the electron transit layer 11b and electron supply layer 11d, a high concentration of two-dimensional electron gas (2DEG) is generated across the GaN/AlGaN interface.

Figure 6B:
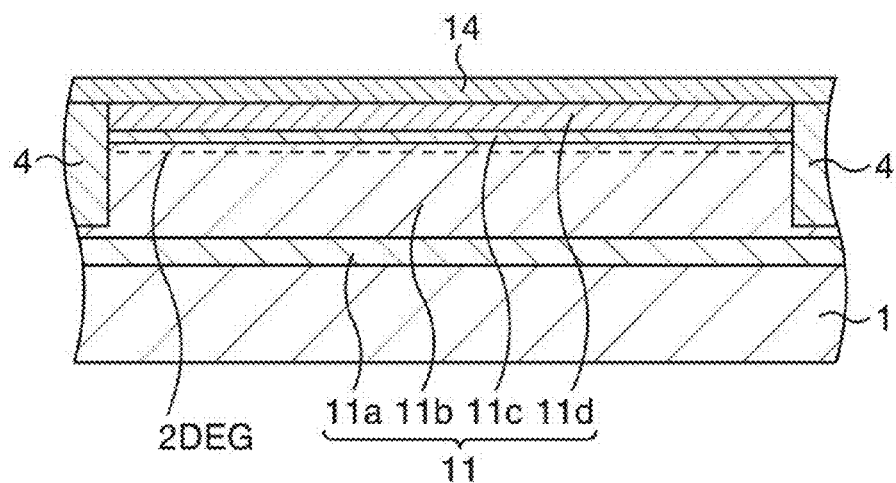

As illustrated in FIG. 6B, an underlying film 14 having a lower coefficient of thermal expansion than GaN is formed.

More specifically, an insulating material having a lower coefficient of thermal expansion than GaN (a silicon oxide ($SiO_2$) in this embodiment) is deposited on the compound semiconductor laminated structure 11 by, e.g., CVD. With this process, the underlying film 14 is formed across a surface of the compound semiconductor laminated structure 11.

Figure 6C:
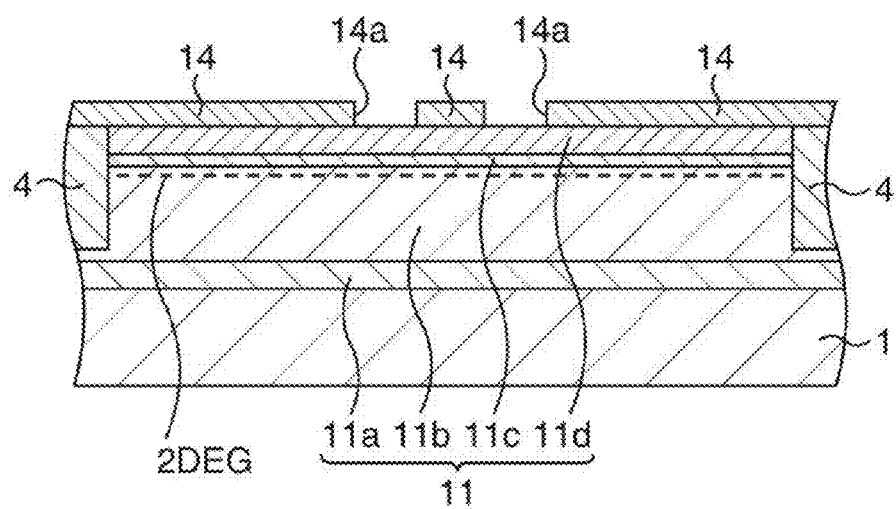

As illustrated in FIG. 6C, openings 14a are formed in the underlying film 14.

More specifically, the underlying film 14 is processed by lithography and dry etching to form the openings 14a at predetermined parts of the underlying film 14 (at two spots in this embodiment).

Figure 7A:
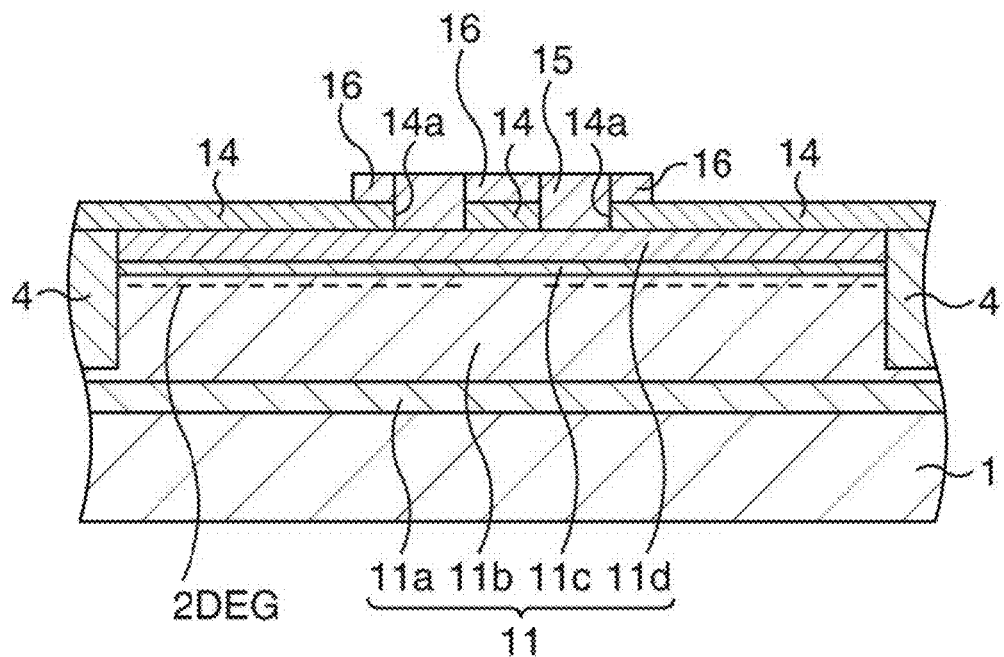
FIGS. 7A and 7B are schematic sectional views illustrating, in the order of steps, the main steps of the method for manufacturing the AlGaN/GaN HEMT according to the third embodiment, following FIGS. 6A to 6C.

As illustrated in FIG. 7A, a semiconductor layer 15 and a p-type semiconductor layer 16 are formed.

A semiconductor (GaN in this embodiment) is selectively epitaxially grown in the openings 14a of the underlying film 14 by, e.g., MOCVD. At this time, the semiconductor is grown until the semiconductor becomes thicker than the underlying film 14. With this process, the semiconductor layer 15 is formed.

After that, p-GaN is grown under growth conditions favorable to lateral growth. With this process, the p-type semiconductor layer 16 is formed. A gaseous mixture of TMGa gas serving as a Ga source and $NH_3$ gas is used as a source gas to grow GaN. A p-type impurity such as one selected from Mg and Be is added to the source gas of GaN. In the present embodiment, the flow rates of $NH_3$ gas are set to about 100 sccm to 10 slm. The growth pressures are set to about 50 to 760 Torr, and the growth temperatures are set to about 800 to 1200° C. Mg is used as the p-type impurity. The doping concentration of Mg is set to, e.g., about $1 \times 10^{16}/cm^3$ to about $1 \times 10^{21}/cm^3$ (e.g., $5 \times 10^{19}/cm^3$).

Since the p-GaN is grown under the conditions favorable to lateral growth, the p-GaN grows laterally on the underlying film 14. The coefficient of thermal expansion of GaN is about $5.6 \times 10^{-6}/K$, and the coefficient of thermal expansion of $SiO_2$ is about $0.5 \times 10^{-6}/K$. The coefficient of thermal expansion of $SiO_2$ is less than 1/10 of that of GaN. The growth temperature of the p-type semiconductor layer 16 is a temperature as high as about 800 to 1200° C. Accordingly, when the growth ends, and the temperature returns to room temperature, tensile strain is applied to the p-type semiconductor layer 16 due to the difference in coefficient of thermal expansion from the underlying film 14.

The portion of the p-type semiconductor layer 16 other than a portion which is formed at a part where a gate electrode of the p-type semiconductor layer 16 is intended to be formed is exposed at one end face. Since the portion is insusceptible to thermal expansion of the underlying film 14 and has a low activation rate, the portion does not affect device characteristics. The portion of the p-type semiconductor layer 16 other than the portion formed at the intended gate electrode forming part may be removed by etching.

In the present embodiment, tensile strain applied to the p-type semiconductor layer 16 increases the activation rate of the p-type impurity (Mg) serving as an acceptor in the p-type semiconductor layer 16. The p-type semiconductor layer 16 counteracts 2DEG at the GaN/AlGaN interface only at a portion corresponding in position to the p-type semiconductor layer 16 to cause the portion to disappear. Since the activation rate of the p-type impurity (Mg) of the p-type semiconductor layer 16 is high in the present embodiment, even if the p-type semiconductor layer 16 is relatively thin, the p-type semiconductor layer 16 can sufficiently counteract 2DEG. Accordingly, a high concentration of 2DEG is secured at a portion requiring 2DEG, and 2DEG disappears efficiently only at the portion corresponding in position to the intended gate electrode forming part. This realizes reliable normally-off operation.

Figure 7B:
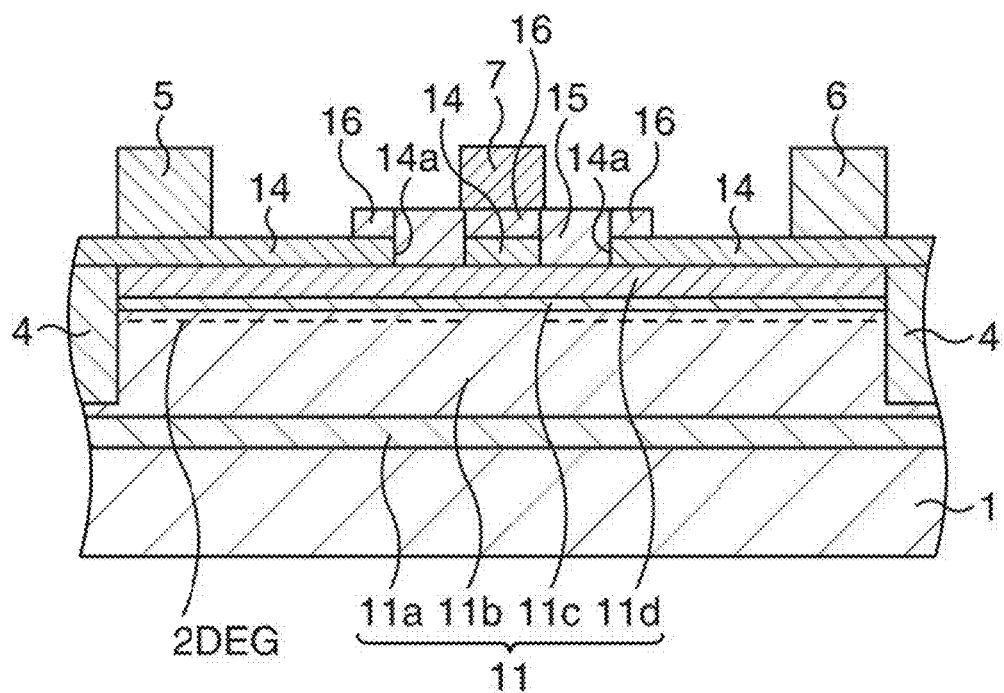

The steps in FIGS. 2A and 2B are performed in order, like the first embodiment. With the steps, as illustrated in FIG. 7B, a source electrode 5 and a drain electrode 6 are formed on the electron supply layer 11d, and a gate electrode 7 is formed on the p-type semiconductor layer 16.

After steps such as formation of pieces of wires to be connected to the source electrode 5, drain electrode 6, and gate electrode 7, an AlGaN/GaN HEMT according to the present embodiment is formed.

As has been described above, according to the present embodiment, the p-type semiconductor layer 16 with tensile strain applied due to the presence of the underlying film 14 is formed. The p-type semiconductor layer 16 causes 2DEG at the GaN/AlGaN interface to disappear only in a region corresponding in position to the p-type semiconductor layer 16. With the above-described configuration, the energy band below the gate electrode 7 is raised, reliable normally-off operation is realized, and a high-quality, highly reliable AlGaN/GaN HEMT is achieved.

An AlGaN/GaN HEMT according to the first, second, or third embodiment is applied to a so-called discrete package.

In the discrete package, a chip of the AlGaN/GaN HEMT according to the first, second, or third embodiment is mounted. The discrete package of the chip of the AlGaN/GaN HEMT according to the first, second, or third embodiment (hereinafter referred to as a HEMT chip) will be illustrated below.

Figure 8:
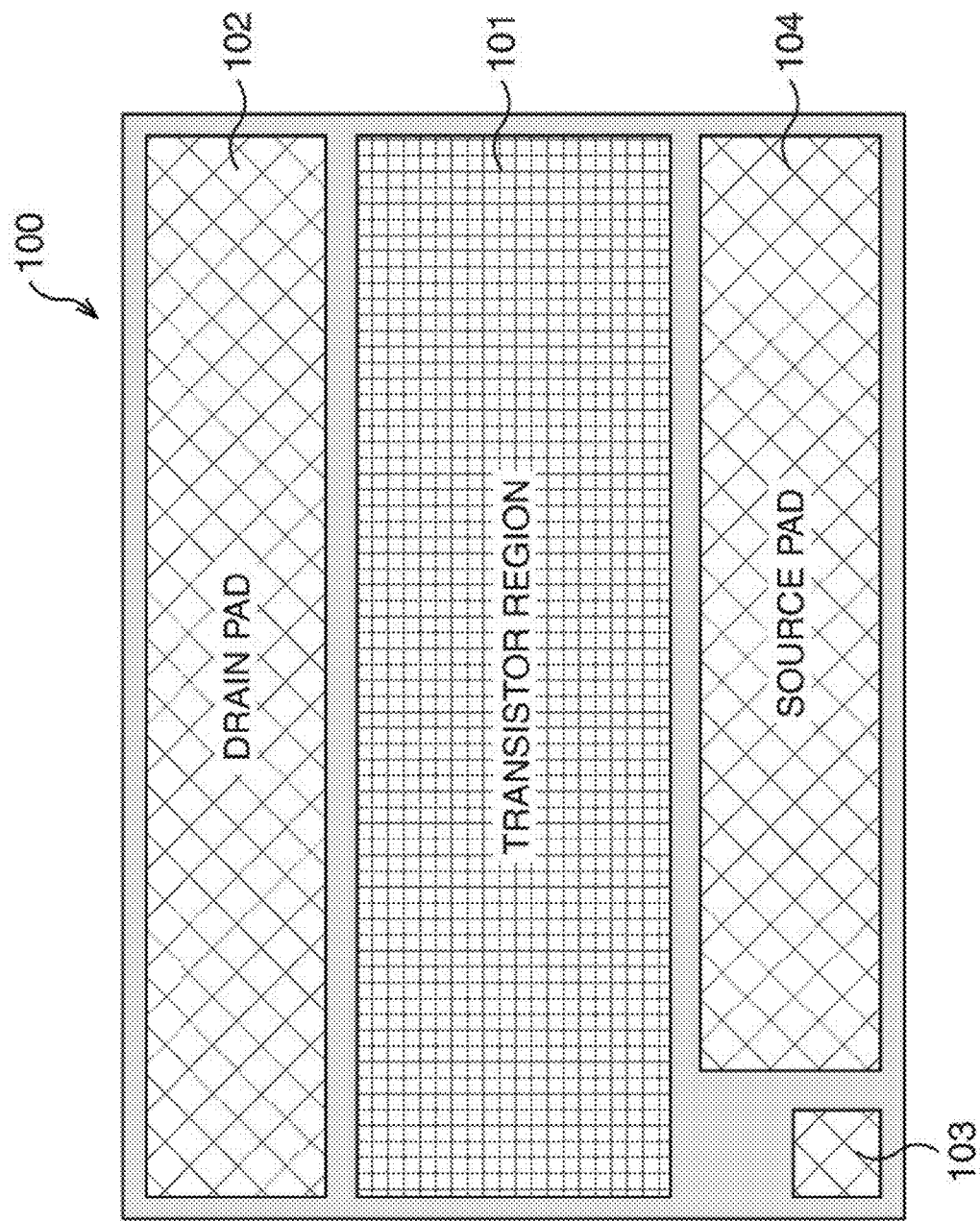
FIG. 8 is a schematic plan view illustrating a HEMT chip using an AlGaN/GaN HEMT according to the first, second, or third embodiment.

The schematic configuration of a HEMT chip is illustrated in FIG. 8.

An HEMT chip 100 includes, on its surface, a transistor region 101 for the above-described AlGaN/GaN HEMT, a drain pad 102 to which a drain electrode is connected, a gate pad 103 to which a gate electrode is connected, and a source pad 104 to which a source electrode is connected.

Figure 9:
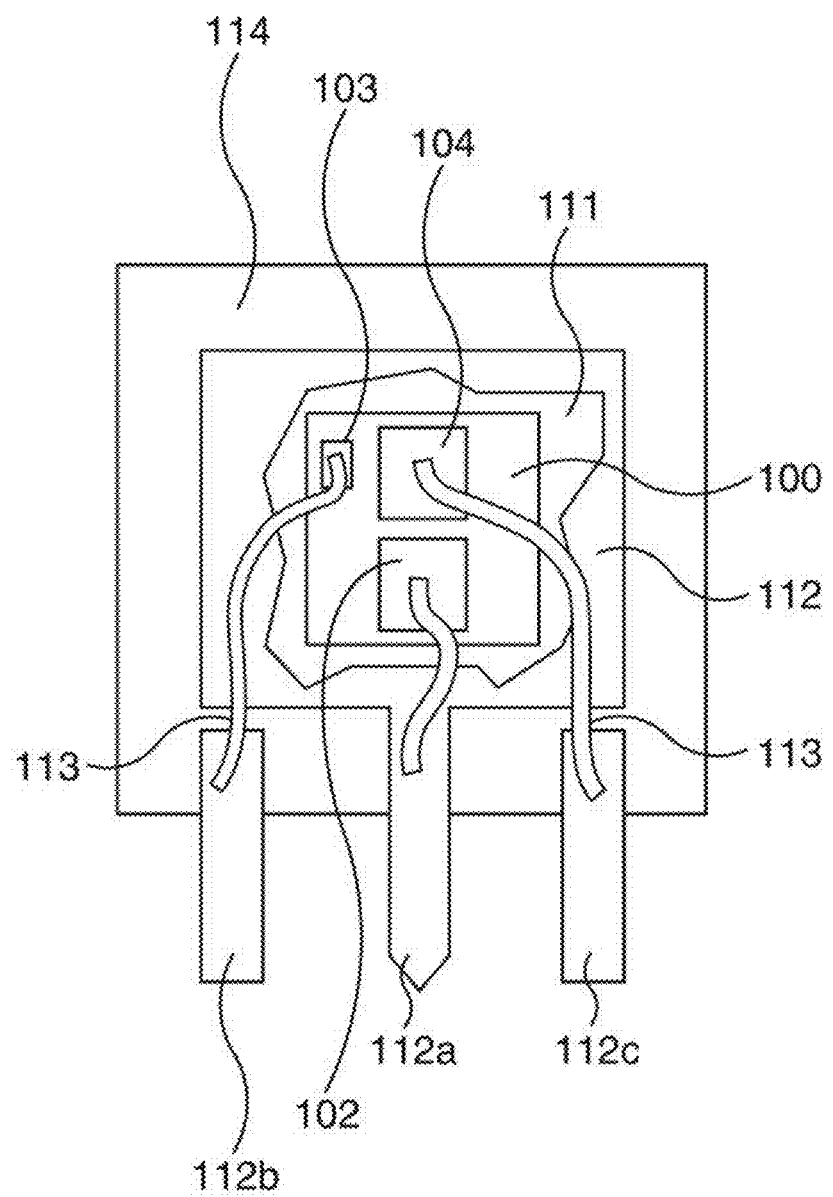
FIG. 9 is a schematic plan view illustrating a discrete package of the HEMT chip using the AlGaN/GaN HEMT according to the first, second, or third embodiment.

FIG. 9 is a schematic plan view illustrating a discrete package.

In order to prepare the discrete package, the HEMT chip 100 is first fixed to a lead frame 112 with a die attaching agent 111 such as solder. A drain lead 112a is formed integrally with the lead frame 112, and a gate lead 112b and a source lead 112c are arranged separately from the lead frame 112 and are spaced apart from each other.

By bonding using Al wires 113, the drain pad 102, the gate pad 103, and the source pad 104 are electrically connected to the drain lead 112a, the gate lead 112b, and the source lead 112c, respectively.

After that, the HEMT chip 100 is sealed with a molding resin 114 by transfer molding, and the lead frame 112 is cut off. With the above-described processes, the discrete package is formed.

Fourth Embodiment

The present embodiment discloses a PFC (Power Factor Correction) circuit including an AlGaN/GaN HEMT according to one selected from the first to third embodiments.

Figure 10:
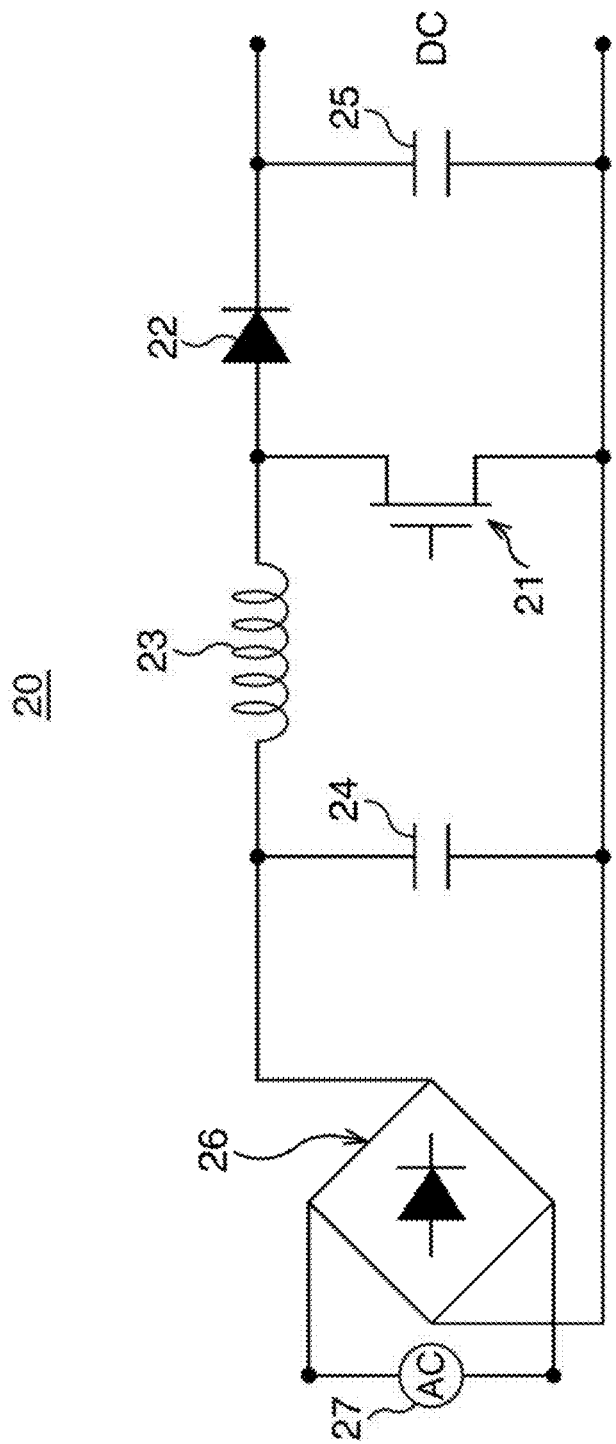
FIG. 10 is a connection diagram illustrating a PFC circuit according to a fourth embodiment.

FIG. 10 is a connection diagram illustrating the PFC circuit.

A PFC circuit 20 includes a switching device (transistor) 21, a diode 22, a choke coil 23, capacitors 24 and 25, a diode bridge 26, and an alternating-current power supply (AC) 27. An AlGaN/GaN HEMT according to one selected from the first to third embodiments is applied to the switching device 21.

In the PFC circuit 20, a drain electrode of the switching device 21, an anode terminal of the diode 22, and one terminal of the choke coil 23 are connected. A source electrode of the switching device 21, one terminal of the capacitor 24, and one terminal of the capacitor 25 are connected. The other terminal of the capacitor 24 and the other terminal of the choke coil 23 are connected. The other terminal of the capacitor 25 and a cathode terminal of the diode 22 are connected. The AC 27 is connected between the two terminals of the capacitor via the diode bridge 26. A direct-current power supply (DC) is connected between the two terminals of the capacitor 25. Note that a PFC controller (not illustrated) is connected to the switching device 21.

In the present embodiment, the AlGaN/GaN HEMT according to the one selected from the first to third embodiments is applied to the PFC circuit 20. This realizes the highly reliable PFC circuit 20.

Fifth Embodiment

The present embodiment discloses a power supply unit including an AlGaN/GaN HEMT according to one selected from the first to third embodiments.

Figure 11:
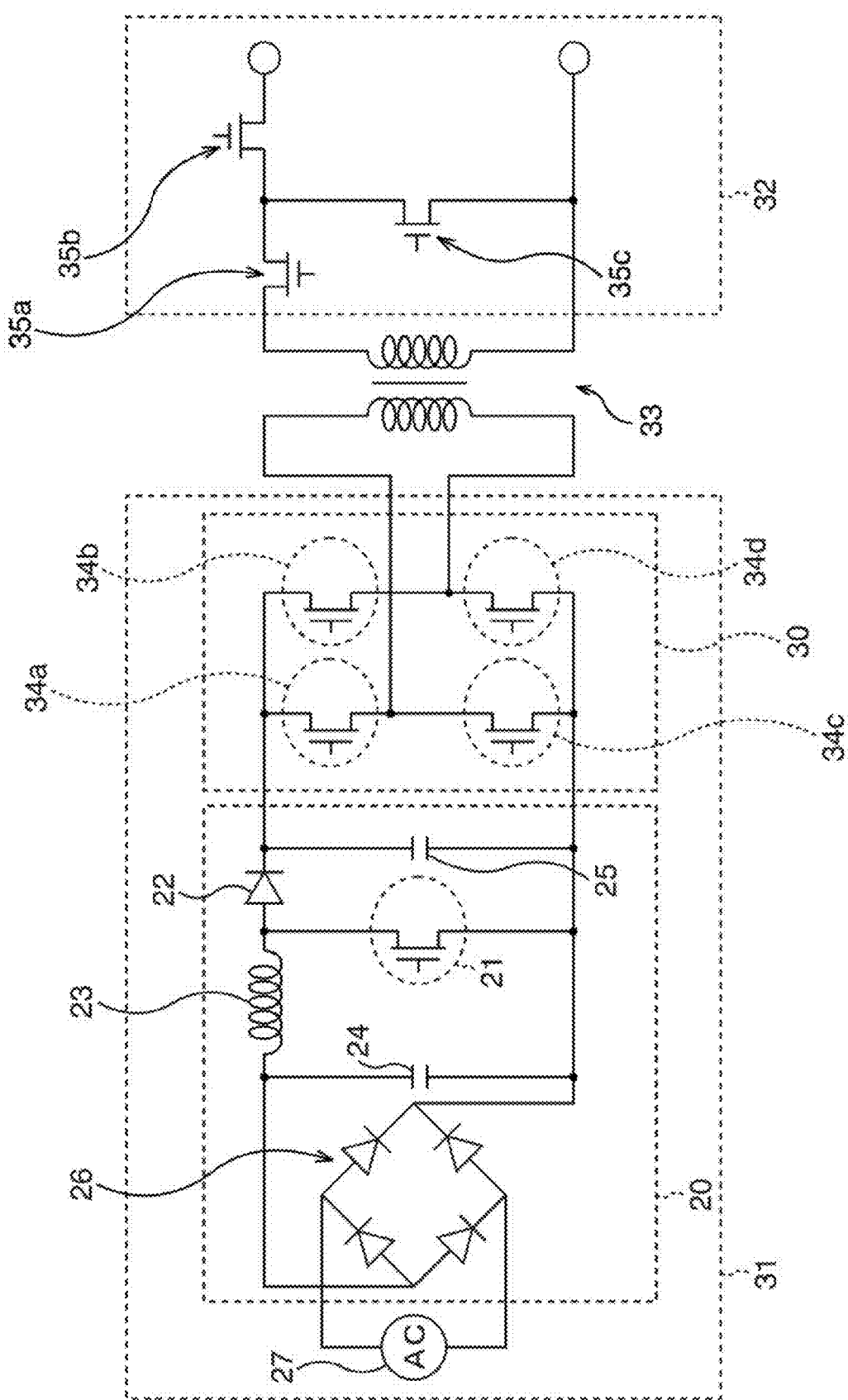
FIG. 11 is a connection diagram illustrating the schematic configuration of a power supply unit according to a fifth embodiment.

FIG. 11 is a connection diagram illustrating the schematic configuration of the power supply unit according to the fifth embodiment.

The power supply unit according to the present embodiment includes a high-voltage primary circuit 31, a low-voltage secondary circuit 32, and a transformer 33 which is disposed between the primary circuit 31 and the secondary circuit 32.

The primary circuit 31 includes a PFC circuit 20 according to the fourth embodiment and an inverter circuit (e.g., a full bridge inverter circuit 30) which is connected between two terminals of a capacitor 25 of the PFC circuit 20. The full bridge inverter circuit 30 includes a plurality of (four in this embodiment) switching devices 34a, 34b, 34c, and 34d.

The secondary circuit 32 includes a plurality of (three in this embodiment) switching devices 35a, 35b, and 35c.

In the present embodiment, a PFC circuit constituting the primary circuit 31 is the PFC circuit 20 according to the fourth embodiment, and the switching devices 34a, 34b, 34c, and 34d of the full bridge inverter circuit 30 are each an AlGaN/GaN HEMT according to one selected from the first to third embodiments. The switching devices 35a, 35b, and 35c of the secondary circuit 32 are each a general MIS-FET using silicon.

In the present embodiment, the PFC circuit according to the fourth embodiment and the AlGaN/GaN HEMTs according to the one selected from the first to third embodiments are applied to the primary circuit 31 that is a high-voltage circuit. This realizes a highly reliable, high-power power supply unit.

Sixth Embodiment

The present embodiment discloses a high-frequency amplifier including an AlGaN/GaN HEMT according to one selected from the first to third embodiments.

Figure 12:
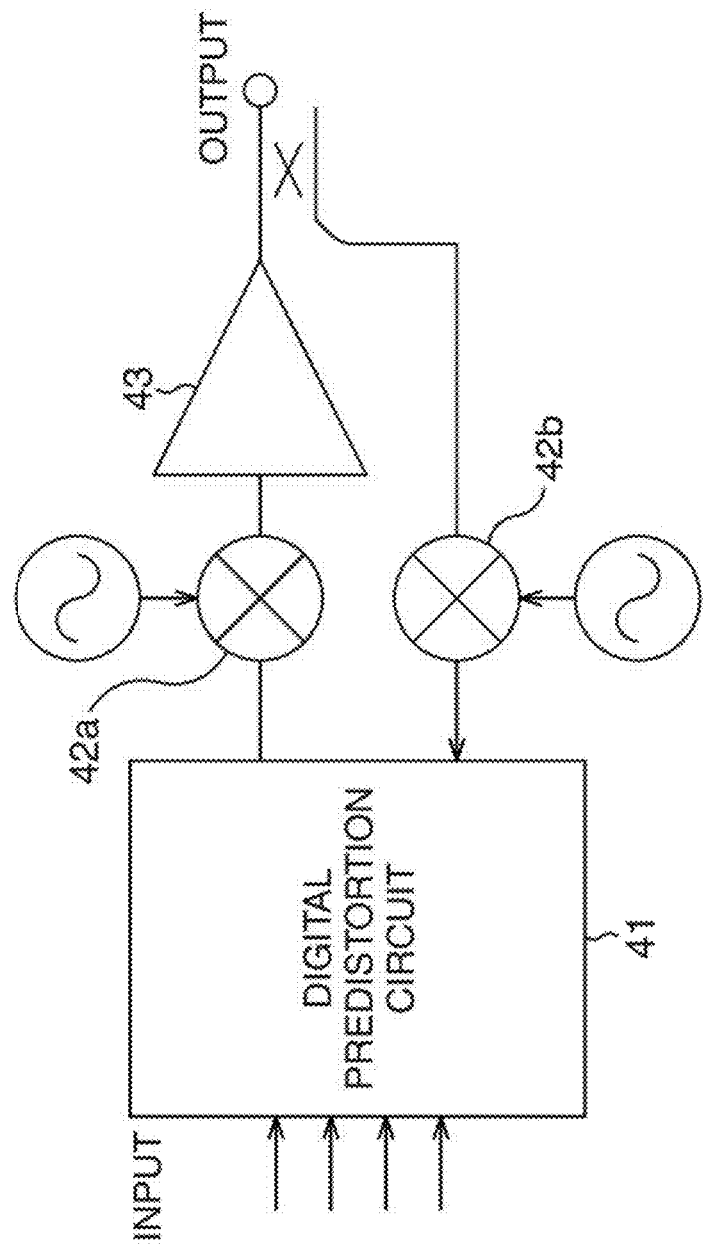
FIG. 12 is a connection diagram illustrating the schematic configuration of a high-frequency amplifier according to a sixth embodiment.

FIG. 12 is a connection diagram illustrating the schematic configuration of the high-frequency amplifier according to the sixth embodiment.

The high-frequency amplifier according to the present embodiment includes a digital predistortion circuit 41, mixers 42a and 42b, and a power amplifier 43.

The digital predistortion circuit 41 is intended to compensate for nonlinear strain of an input signal. The mixer 42a is intended to mix the input signal whose nonlinear strain has been compensated for and an AC signal. The power amplifier 43 is intended to amplify the input signal mixed with the AC signal and includes an AlGaN/GaN HEMT according to one selected from the first to third embodiments. Note that the high-frequency amplifier in FIG. 12 is configured so as to be capable of mixing a signal on the output side with an AC signal in the mixer 42b and sending out the mixed signal to the digital predistortion circuit 41 by, e.g., flipping a switch.

In the present embodiment, the AlGaN/GaN HEMT according to the one selected from the first to third embodiments is applied to the high-frequency amplifier. This realizes a highly reliable, high-voltage, high-frequency amplifier.

Other Embodiments

The first to third embodiments have illustrated an AlGaN/GaN HEMT as a compound semiconductor device. The embodiments can be applied to the HEMTs below as compound semiconductor devices, in addition to an AlGaN/GaN HEMT.

Example 1 of Other Devices

The present example discloses an InAlN/GaN HEMT as a compound semiconductor device.

InAlN and GaN are compound semiconductors whose lattice constants can be made closer to each other by changing the composition. In the case of the first embodiment described above, a tensile strain applying layer is formed from i-InGaN, an electron transit layer is formed from i-GaN, an intermediate layer is formed from AlN, an electron supply layer is formed from n-InAlN, and a p-type semiconductor layer is formed from p-GaN. In the cases of the second and third embodiments described above, an electron transit layer is formed from i-GaN, an intermediate layer is formed from AlN, an electron supply layer is formed from n-InAlN, and a p-type semiconductor layer is formed from p-GaN. Since piezoelectric polarization hardly occurs in these cases, two-dimensional electron gas is generated mainly due to spontaneous polarization of InAlN.

According to the present example, a highly reliable InAlN/GaN HEMT is achieved which realizes reliable normally-off operation without deteriorating device performance, like the above-described AlGaN/GaN HEMTs.

Example 2 of Other Devices

The present example discloses an InAlGaN/GaN HEMT as a compound semiconductor device.

GaN and InAlGaN are compound semiconductors, and the lattice constant of the latter can be made lower than that of the former by changing the composition. In the case of the first embodiment described above, a tensile strain applying layer is formed from i-InGaN, an electron transit layer is formed from i-GaN, an intermediate layer is formed from i-InAlGaN, an electron supply layer is formed from n-InAlGaN, and a p-type semiconductor layer is formed from p-GaN. In the cases of the second and third embodiments described above, an electron transit layer is formed from i-GaN, an intermediate layer is formed from i-InAlGaN, an electron supply layer is formed from n-InAlGaN, and a p-type semiconductor layer is formed from p-GaN.

According to the present example, a highly reliable InAlGaN/GaN HEMT is achieved which realizes reliable normally-off operation without deteriorating device performance, like the above-described AlGaN/GaN HEMTs.

According to the above-described aspects, a highly reliable compound semiconductor device is achieved which realizes reliable normally-off operation without deteriorating device performance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A compound semiconductor device comprising:
a compound semiconductor laminated structure;
an electrode formed above the compound semiconductor laminated structure; and
a p-type semiconductor layer formed between the compound semiconductor laminated structure and the electrode,
wherein an underlying film that has a lower coefficient of thermal expansion than the p-type semiconductor layer is formed between the compound semiconductor laminated structure and the p-type semiconductor layer, and
wherein the p-type semiconductor layer has tensile strain in a direction parallel to a surface of the compound semiconductor laminated structure resulting from a difference in coefficient of thermal expansion from the underlying film.
2. The compound semiconductor device according to claim 1, wherein
an opening is formed in the underlying film, and
the p-type semiconductor layer is formed on the underlying film so as to fill in the opening.
3. A method for manufacturing the compound semiconductor device comprising:
forming a compound semiconductor laminated structure; and
forming a p-type semiconductor layer in an electrode forming region above the compound semiconductor laminated structure,
forming an underlying film that has a lower coefficient of thermal expansion than the p-type semiconductor layer between the compound semiconductor laminated structure and the p-type semiconductor layer, wherein
the p-type semiconductor layer has tensile strain in a direction parallel to a surface of the compound semiconductor laminated structure resulting from a difference in coefficient of thermal expansion from the underlying film.
4. The method for manufacturing the compound semiconductor device according to claim 3, wherein
an opening is formed in the underlying film, and
the p-type semiconductor layer is formed on the underlying film so as to fill in the opening.

* * * * *